US012781053B2

(12) United States Patent
Chen et al.

(10) Patent No.: US 12,781,053 B2
(45) Date of Patent: Nov. 3, 2026

(54) PREPARATION METHOD FOR SPHERICAL SILICA POWDER FILLER, POWDER FILLER OBTAINED THEREBY AND USE THEREOF

(71) Applicant: ZHEJIANG THIRD AGE MATERIAL TECHNOLOGY CO., LTD, Huzhou (CN)

(72) Inventors: Shuzhen Chen, Huzhou (CN); Rui Li, Huzhou (CN); Ke Wang, Huzhou (CN); Lieping Ding, Huzhou (CN); Haibin Shen, Huzhou (CN)

(73) Assignee: Zhejiang Third Age Material Technology Co., Ltd., Huzhou (CN)

( * ) Notice: Subject to any disclaimer, the term of this patent is extended or adjusted under 35 U.S.C. 154(b) by 753 days.

(21) Appl. No.: 17/800,073

(22) PCT Filed: Apr. 26, 2020

(86) PCT No.: PCT/CN2020/086980
§ 371 (c)(1),
(2) Date: Aug. 16, 2022

(87) PCT Pub. No.: WO2021/164124
PCT Pub. Date: Aug. 26, 2021

(65) Prior Publication Data

US 2023/0108010 A1 Apr. 6, 2023

Related U.S. Application Data

(63) Continuation of application No. PCT/CN2020/075559, filed on Feb. 17, 2020, and a continuation of application No. 17/799,793, filed as application No. PCT/CN2020/075559 on Feb. 17, 2020, now Pat. No. 12,335,198.

(30) Foreign Application Priority Data

Feb. 17, 2020 (WO) ................ PCT/CN2020/075559

(51) Int. Cl.

| | |
|---|---|
| ***C09C 1/30*** | (2006.01) |
| ***C01B 33/18*** | (2006.01) |
| ***C08G 77/00*** | (2006.01) |
| ***C08G 77/06*** | (2006.01) |
| ***C08K 9/06*** | (2006.01) |
| ***C09C 3/12*** | (2006.01) |
| ***H05K 1/03*** | (2006.01) |
| ***H10W 74/47*** | (2026.01) |

(52) U.S. Cl.
CPC .......... *C09C 1/3081* (2013.01); *C01B 33/181* (2013.01); *C08G 77/06* (2013.01); *C08K 9/06* (2013.01); *C09C 3/12* (2013.01); *H05K 1/0373* (2013.01); *C01P 2004/32* (2013.01); *C01P 2004/61* (2013.01); *C01P 2004/62* (2013.01); *C08G 77/70* (2013.01); *H10W 74/473* (2026.01)

(58) Field of Classification Search
CPC ....... C09C 1/3081; C09C 3/12; C01B 33/181; C08G 77/06; C08G 77/70; C08K 9/06; H05K 1/0373; C01P 2004/32; C01P 2004/61; C01P 2004/62; H01L 23/295
See application file for complete search history.

(56) References Cited

U.S. PATENT DOCUMENTS

| | | | | |
|---|---|---|---|---|
| 2010/0263919 A1* | 10/2010 | Lee | ...................... | H05K 1/0373 174/257 |
| 2017/0306150 A1* | 10/2017 | Nishida | .................. | C08G 77/20 |
| 2022/0275122 A1* | 9/2022 | Koda | ...................... | B32B 5/263 |

FOREIGN PATENT DOCUMENTS

| | | | |
|---|---|---|---|
| CN | 1311266 | A | 9/2001 |
| CN | 1738850 | A | 2/2006 |
| CN | 104245874 | A | 12/2014 |
| CN | 104355314 | A | 2/2015 |
| CN | 104744700 | A | 7/2015 |
| CN | 109399648 | A | 3/2019 |
| CN | 110015666 | A | 7/2019 |
| CN | 110016242 | A | 7/2019 |
| IN | 107128935 | A | 9/2017 |
| JP | 2002037620 | A | 2/2002 |
| JP | 2002080598 | A * | 3/2002 |
| KR | 100692612 | B1 | 3/2007 |

OTHER PUBLICATIONS

Yang et al., "Polymer Chemistry," Polysiloxanes, Sichuan University Press, Dec. 2015, pp. 1-6.
International Search Report with English Translation and Written Opinion for PCT Application No. PCT/CN2020/075559, dated Nov. 19, 2020, 11 pages.
International Search Report with English Translation and Written Opinion for PCT Application No. PCT/CN2020/086980, dated Nov. 17, 2020, 9 pages.

* cited by examiner

*Primary Examiner* — Robert S Jones, Jr.
*Assistant Examiner* — Elizabeth Amato
(74) *Attorney, Agent, or Firm* — Olive Law Group, PLLC

(57) ABSTRACT

A preparation method for a spherical silica powder filler, comprises the following steps: S1, providing spherical polysiloxane comprising T units by means of a hydrolysis condensation reaction of $R_1SiX_3$, wherein $R_1$ is hydrogen atom or an independently selectable organic group having 1 to 18 carbon atoms, X is a hydrolyzable group, and the T unit is $R_1SiO_3$—; and S2, calcining the spherical polysiloxane under the condition of a dry oxidizing gas atmosphere at a calcining temperature between 850° C. and 1200° C., so as to obtain a spherical silica powder filler having a low hydroxyl content. The spherical silica powder filler is composed of at least one selected from $Q_1$ unit, $Q_2$ unit, $Q_3$ unit and $Q_4$ unit, wherein $Q_1$ unit is $Si(OH)_3O$—, $Q_2$ unit is $Si(OH)_2O_2$—, $Q_3$ unit is $SiOHO_3$—, $Q_4$ unit is $SiO_4$—, and the content of $Q_4$ unit is greater than or equal to 95%.

12 Claims, No Drawings

PREPARATION METHOD FOR SPHERICAL SILICA POWDER FILLER, POWDER FILLER OBTAINED THEREBY AND USE THEREOF

CROSS-REFERENCE TO RELATED APPLICATIONS

This present application is a national stage application of International Patent Application No. PCT/CN2020/086980, filed on Apr. 26, 2020, which is a continuation of International Patent Application No. PCT/CN2020/075559, filed on Feb. 17, 2020. This present application is also a continuation of U.S. patent application Ser. No. 17/799,793, filed on Aug. 15, 2022, which is a national stage application of International Patent Application No. PCT/CN2020/075559. The contents of these applications are hereby incorporated by reference in their entireties.

BACKGROUND OF THE INVENTION

1. Field of the Invention

The present invention relates to circuit boards, and more particularly to a preparation method for a spherical silica powder filler, powder filler obtained thereby and use.

2. Related Art

In the field of 5G communication, equipments assembled by the radio frequency devices and circuit boards such as high-density interconnect boards (HDI), high-frequency high-speed boards and motherboards, etc. are required. These circuit boards are generally composed of fillers and organic polymers such as epoxy resin, aromatic polyether and fluororesin, etc. The fillers are mainly angular or spherical silica whose main function is to reduce the thermal expansion coefficient of organic polymers. The spherical or angular silica is tightly packed and graded in the existing fillers.

On the one hand, with the advancement of technology, the signal frequency used by semiconductors is getting higher and higher, and the high-speed and low-loss signal transmission speed requires fillers with low dielectric loss and low dielectric constant. The dielectric constant of material basically depends on its chemical composition and structure, and silica has its inherent dielectric constant. On the other hand, the dielectric loss is related to the polar groups, such as hydroxyl groups of the filler, the more the hydroxyl groups, the greater the dielectric loss. The high-temperature flame heating method is commonly used for the traditional spherical silica, wherein the physical melting or chemical oxidation is used to prepare the spherical silica. The flame is generally formed by the combustion of LPG, NG and other hydrocarbon fuels with oxygen, and a large amount of water molecules are produced in the flame. Therefore, there are a large number of polar hydroxyl groups inside and on the surface of the obtained silicon oxide powder, resulting in increased dielectric loss, which cannot meet the requirement for the dielectric properties of high-frequency and high-speed circuit boards in the 5G communication era. Another disadvantage of the flame method is that the flame temperature is generally higher than the boiling point of silica at 2230 degrees, causing the generation of silica below tens of nanometers (such as below 50 nm) by condensed after gasification. The specific surface area and diameter of spherical silica have a reciprocal function relationship: specific surface area=constant/particle diameter. That is, a decrease in diameter leads to a sharp increase in specific surface area. For example, the calculated specific surface area of spherical silica with a diameter of 0.5 μm is 5.6 $m^2/g$, and the calculated specific surface area of spherical silica with a diameter of 50 nm is 54.5 $m^2/g$. The increase in the specific surface area leads to an increase in the amount of adsorbed water. A water molecule can be understood as containing two hydroxyl groups, which will cause the dielectric loss of silicon oxide powder to deteriorate sharply.

SUMMARY OF THE INVENTION

In order to solve the problem that the silica powder filler has a relatively high hydroxyl content in the prior art, the present invention provides a preparation method for a spherical silica powder filler, powder filler obtained thereby and use.

The present invention provides a preparation method for a spherical silica powder filler, comprising: S1, providing spherical polysiloxane comprising T units by means of a hydrolysis condensation reaction of $R_1SiX_3$, wherein $R_1$ is hydrogen atom or an independently selectable organic group having 1 to 18 carbon atoms, X is a hydrolyzable group, and the T unit is $R_1SiO_3$—; S2, calcining the spherical polysiloxane under the condition of a dry oxidizing gas atmosphere at a calcining temperature between 850 degrees and 1200 degrees, so as to obtain a spherical silica powder filler having a low hydroxyl content, wherein the spherical silica powder filler is composed of at least one selected from $Q_1$ unit, $Q_2$ unit, $Q_3$ unit and $Q_4$ unit, wherein $Q_1$ unit is $Si(OH)_3O$—, $Q_2$ unit is $Si(OH)_2O_2$—, $Q_3$ unit is $SiOHO_3$—, $Q_4$ unit is $SiO_4$—, and the content of $Q_4$ unit is greater than or equal to 95%.

Preferably, the hydrolyzable group X is an alkoxy group such as a methoxy group, an ethoxy group, and a propoxy group, etc, or a halogen atom such as a chlorine atom, etc. The catalyst for the hydrolysis condensation reaction may be a base and/or an acid.

Preferably, the oxidizing gas contains oxygen to oxidize all the organics in the polysiloxane. For saving cost, the oxidizing gas is the air. In order to reduce the hydroxyl content of the calcined silica, the less moisture content in the air, the better. For saving cost, the compressed air after removing water by a freeze dryer is suitable for the calcination atmosphere of the present invention. Specifically, the step S2 comprises that the spherical polysiloxane powder is put into a muffle furnace and dry air is introduced for calcination.

Preferably, the calcination of the spherical polysiloxane is achieved by electric heating or indirect heating with combustion gas. It should be understood that the present invention has no particular limitation on the heating method. However, since the burning gas contains moisture, the direct heating by the gas flame should be avoided as much as possible in the present invention. The temperature can be gradually increased during calcination. Slow heating at a temperature lower than 850 degrees and room temperature is beneficial to the slow decomposition of organic groups, in order to reduce the residual carbon in the final silica after the calcination. When the amount of residual carbon is high, the whiteness of silica decreases.

Preferably, the calcining temperature is between 850 degrees and 1100 degrees, and the calcining time is between 6 hours and 12 hours.

Preferably, the spherical polysiloxane further comprises a Q unit, a D unit, and/or a M unit, wherein Q unit is $SiO_4$—, D unit is $R_2R_3SiO_2$—, M unit is $R_4R_5R_6SiO$—, wherein each of $R_2$, $R_3$, $R_4$, $R_5$, $R_6$ is a hydrogen atom or an independently selectable hydrocarbon group having 1 to 18 carbon atoms. For example, in a preferred embodiment, $Si(OC_2C_3)_4$, $CH_3CH_3Si(OCH_3)_2$ can be combined with $CH_3Si(OCH_3)_3$.

Preferably, the preparation method further comprises adding a treatment agent to perform surface treatment on the spherical silica powder filler, and the treatment agent comprises a silane coupling agent and/or disilazane; the silane coupling agent is $(R_7)_a(R_8)_bSi(M)_{4-a-b}$, wherein each of $R_7$, $R_8$ is a hydrogen atom, an independently selectable hydrocarbon group having 1 to 18 carbon atoms, or an independently selectable hydrocarbon group having 1 to 18 carbon atoms replaced by a functional group, wherein the functional group is selected from at least one of the following organic functional groups: vinyl, allyl, styryl, epoxy group, aliphatic amino, aromatic amino, methacryloxypropyl, acryloyloxypropyl, ureidopropyl, chloropropyl, mercaptopropyl, polysulfide group, isocyanate propyl; M is an alkoxy group with 1 to 18 carbon atoms or a halogen atom, a is 0, 1, 2 or 3, b is 0, 1, 2 or 3, a+b is 1, 2 or 3; the disilazane is $(R_9R_{10}R_{11})SiNHSi(R_{12}R_{13}R_{14})$, wherein each of $R_9$, $R_{10}$, $R_{11}$, $R_{12}$, $R_{13}$, $R_{14}$ is a hydrogen atom or an independently selectable hydrocarbon group having 1 to 18 carbon atoms.

The present invention also provides a spherical silica powder filler obtained according to the above-mentioned preparation method, wherein the spherical silica powder filler has a low hydroxyl content, and an average particle size of the spherical silica powder filler is between 0.1 μm and 5 μm. More preferably, the average particle size of the spherical silica powder filler is between 0.15 μm and 4.5 μm.

The present invention also provides a use of the spherical silica powder filler, wherein the spherical silica powder filler of different particle sizes is tightly packed and graded in resin to form a composite material, which is suitable for circuit board material and semiconductor packaging material. Preferably, the spherical silica powder filler is suitable for high-frequency high-speed circuit boards, prepregs, copper clad boards and other semiconductor packaging materials that require low dielectric loss.

Preferably, coarse particles above 1 μm, 3 μm, 5 μm, 10 μm, or 20 μm in the spherical silica powder filler are removed by a dry or wet sieving or inertial classification.

The spherical silica powder filler according to the present invention has a low hydroxyl content, a low dielectric loss and a low thermal expansion coefficient, and is suitable for high-frequency high-speed circuit boards, prepregs or copper clad boards, etc.

DESCRIPTION OF THE ENABLING EMBODIMENT

The preferred embodiments of the present invention are given below and described in detail.

The detection methods involved in the following embodiments are listed as follows.

The average particle size is measured with HORIBA's laser particle size distribution analyzer LA-700.

The contents of $Q_1$ unit, $Q_2$ unit, $Q_3$ unit and $Q_4$ unit of the spherical silica powder filler are analyzed by $^{29}Si$ solid-state NMR nuclear magnetic resonance spectroscopy and calculated based on the nuclear magnetic resonance absorption peak area of $Q_1$ unit, $Q_2$ unit, $Q_3$ unit and $Q_4$ unit. $Q_4$ unit content (%)=($Q_4$ unit peak area/($Q_1$ unit peak area+$Q_2$ unit peak area+$Q_3$ unit peak area+$Q_4$ unit peak area))×100.

The dielectric loss test method comprises: mixing different volume fractions of sample powders and paraffin to make test samples, and using a commercially available high-frequency dielectric loss meter to measure the dielectric loss under the condition of 10 GHz. Then the dielectric loss of the sample is obtained from the slope in the coordinate, wherein the ordinate represents the dielectric loss, and the abscissa represents the volume fraction. The dielectric losses of the Examples and Comparative Examples of the present invention at least can be relatively compared although it is generally difficult to obtain the absolute value of the dielectric loss.

In this text, "degrees" refers to Celsius degrees, i.e., ° C.

In this text, the average particle size refers to the volume average diameter of the particles.

Embodiment 1

Deionized water of a certain weight at room temperature was added into a reactor with a stirrer. While stirring, methyltrimethoxysilane of 80 by weight was added and a small amount of acetic acid was added to adjust the pH to about 5. After the methyltrimethoxysilane was dissolved, 5% ammonia water of 25 by weight was added and stirred for 10 seconds, and then the stirring was stopped. After standing for 1 hour, it was filtered and dried to obtain spherical polysiloxane. The polysiloxane powder was put into a muffle furnace and dry air was introduced for calcination. The final calcining temperature was 850 degrees, 1000 degrees or 1100 degrees, and the calcining time was 12 hours. The analysis results of the samples were listed in following Table 1.

TABLE 1

| | Deionized Water by Weight | Average Particle Size (μm) | Final Calcining Temperature (° C.) | $Q_4$ Unit Content (%) | Dielectric Loss (10 GHz) |
|---|---|---|---|---|---|
| Example 1 | 1500 | 0.8 | 1000 | >99 | 0.00005 |
| Example 2 | 1100 | 1.2 | 1100 | >99 | 0.00003 |
| Example 3 | 800 | 3.0 | 850 | 96.0 | 0.00008 |
| Example 4 | 600 | 4.5 | 1100 | >99 | 0.00002 |
| Comparative Example 1 | 800 | 3.0 | 750 | 94.5 | 0.0010 |

Embodiment 2

Deionized water of 1100 by weight at room temperature was added into a reactor with a stirrer. While stirring, propyltrimethoxysilane of 80 by weight was added and a small amount of acetic acid was added to adjust the pH to about 5. After the propyltrimethoxysilane was dissolved, 5% ammonia water of 25 by weight was added and stirred for 10 seconds, and then the stirring was stopped. After standing for 1 hour, it was filtered and dried to obtain spherical polysiloxane. The polysiloxane powder was put into a muffle furnace and dry air was introduced for calcination. The final calcining temperature was 950 degrees, and the calcining time was 6 hours. The analysis result of the sample was listed in following Table 2.

TABLE 2

| | Average Particle Size (μm) | Final Calcining Temperature (° C.) | $Q_4$ Unit Content (%) | Dielectric Loss (10 GHz) |
|---|---|---|---|---|
| Example 5 | 0.6 | 950 | 97.0 | 0.00006 |

Embodiment 3

Deionized water of 2500 by weight at 40° C. was added into a reactor with a stirrer. While stirring, methyltrimethoxysilane of 80 by weight was added and a small amount of acetic acid was added to adjust the pH to about 5. After the methyltrimethoxysilane was dissolved, 5% ammonia water of 60 by weight was added and stirred for 10 seconds, and then the stirring was stopped. After standing for 1 hour, it was filtered and dried to obtain spherical polysiloxane. The polysiloxane powder was put into a muffle furnace and dry air was introduced for calcination. The final calcining temperature was 1000 degrees, and the calcining time was 12 hours. The heating method was changed to natural gas combustion (comparative example 2) with the direct combustion gas heating. The final calcining temperature was 1000 degrees, and the calcining time was 12 hours. The analysis results of the sample were listed in following Table 3. Obviously, the hydroxyl group in the silica was increase due to the moisture contained in the hot gas after natural gas combustion.

TABLE 3

| | Average Particle Size (μm) | Final Calcining Temperature (° C.) | $Q_4$ Unit Content (%) | Dielectric Loss (10 GHz) |
|---|---|---|---|---|
| Example 6 | 0.15 | 1000 | 95.0 | 0.00009 |
| Comparative Example 2 | 0.15 | 1000 | 92.5 | 0.0019 |

Embodiment 4

The crushed silica with an average particle size of 2 μm was sent to a spheroidizing furnace with a flame temperature of 2500 degrees for melting and spheroidizing. All the spheroidized powders were collected as sample of Comparative Example 3. The analysis result of the sample was listed in following Table 4.

TABLE 4

| | Average Particle Size (μm) | $Q_4$ Unit Content (%) | Dielectric Loss (10 GHz) |
|---|---|---|---|
| Comparative Example 3 | 3.0 | 93.0 | 0.0014 |

It should be understood that the samples obtained in the Examples 1-6 may be surface-treated. Specifically, vinyl silane coupling agent, epoxy silane coupling, disilazane, etc. can be used to treat the samples as required. Also, at least two treatment agents can be used to treat the samples as required.

It should be understood that coarse particles above 1 μm, 3 μm, 5 μm, 10 μm, or 20 μm in the spherical silica powder filler are removed by a dry or wet sieving or inertial classification.

It should be understood that the spherical silica powder filler of different particle sizes is tightly packed and graded in resin to form a composite material.

The foregoing description refers to preferred embodiments of the present invention and is not intended to limit the scope of the present invention. Various changes can be made to the foregoing embodiments of the present invention. That is to say, all simple and equivalent changes and modifications made in accordance with the claims of the present invention and the content of the description fall into the protection scope of the patent of the present invention. What is not described in detail in the present invention is conventional technical content.

What is claimed is:

1. A preparation method for a spherical silica powder filler, comprising:

S1, providing spherical polysiloxane comprising T units by means of a hydrolysis condensation reaction of $R_1SiX_3$, wherein $R_1$ is hydrogen or an independently selectable organic group having 1 to 18 carbon atoms, X is a hydrolyzable group, wherein the hydrolyzable group comprises a halogen atom, and the T unit is $R_1SiO_3$—; and S2, calcining the spherical polysiloxane under a condition of a dry oxidizing gas atmosphere consisting of air having moisture removed by a freeze dryer, wherein the calcining is performed by avoiding direct heating by a gas flame, at a calcining temperature between 1000° C. and 1100° C., so as to obtain a spherical silica powder filler having a $Q_4$ unit content of at least 95% as measured by $^{29}Si$ nuclear magnetic resonance (NMR) and a dielectric loss tangent between 0.00002 and 0.00005 as measured at 10 GHz, wherein the spherical silica powder filler further comprises at least one selected from $Q_1$ unit, $Q_2$ unit, and $Q_3$ unit, wherein $Q_1$ unit is $Si(OH)_3O$—, $Q_2$ unit is $Si(OH)_2O_2$—, $Q_3$ unit is $SiOH(O_3)^2$—, $Q_4$ unit is $SiO_4$—.

2. The preparation method according to claim 1, wherein the oxidizing gas contains oxygen to oxidize all the organics in the polysiloxane.

3. The preparation method according to claim 1, wherein the calcination of the spherical polysiloxane is achieved by electric heating or indirect heating with combustion gas.

4. The preparation method according to claim 1, wherein the spherical polysiloxane further comprises a Q unit, a D unit, and/or a M unit, wherein Q unit is $SiO_4$—, D unit is $R_2R_3SiO_2$—, M unit is $R_4R_5R_6SiO$—, wherein each of $R_2$, $R_3$, $R_4$, $R_5$, $R_6$ is a hydrogen atom or an independently selectable hydrocarbon group having 1 to 18 carbon atoms.

5. The preparation method according to claim 1, wherein the preparation method further comprises adding a treatment agent to perform surface treatment on the spherical silica powder filler, and the treatment agent comprises a silane coupling agent and/or disilazane; the silane coupling agent is $(R_7)_a(R_8)_bSi(M)_{4-a-b}$, wherein each of $R_7$, $R_8$ is a hydrogen atom, an independently selectable hydrocarbon group having 1 to 18 carbon atoms, or an independently selectable hydrocarbon group having 1 to 18 carbon atoms replaced by a functional group, wherein the functional group is selected from at least one of the following organic functional groups: vinyl, allyl, styryl, epoxy group, aliphatic amino, aromatic amino, methacryloxypropyl, acryloyloxypropyl, ureidopropyl, chloropropyl, mercaptopropyl, polysulfide group, isocyanate propyl; M is an alkoxy group with 1 to 18 carbon atoms or a halogen atom, a is 0, 1, 2, or 3, b is 0, 1, 2, or 3, a+b is 1, 2, or 3; and the disilazane is $(R_9R_{10}R_{11})SiNHSi(R_{12}R_{13}R_{14})$, wherein each of $R_9$, $R_{10}$, $R_{11}$, $R_{12}$, $R_{13}$, $R_{14}$ is a hydrogen atom or an independently selectable hydrocarbon group having 1 to 18 carbon atoms.

6. The preparation method according to claim 1, wherein the spherical silica powder filler has a low hydroxyl content, and an average particle size of the spherical silica powder filler is between 0.1 μm and 5 μm.

7. The preparation method according to claim 1, wherein the spherical silica powder filler has $Q_4$ unit content of at least 95% as measured by $^{29}$Si nuclear magnetic resonance (NMR), and an average particle size of the spherical silica powder filler is between 0.1 μm and 5 μm.

8. The preparation method according to claim 2, wherein the spherical silica powder filler has $Q_4$ unit content of at least 95% as measured by $^{29}$Si nuclear magnetic resonance (NMR), and an average particle size of the spherical silica powder filler is between 0.1 μm and 5 μm.

9. The preparation method according to claim 3, wherein the spherical silica powder filler has $Q_4$ unit content of at least 95% as measured by $^{29}$Si nuclear magnetic resonance (NMR), and an average particle size of the spherical silica powder filler is between 0.1 μm and 5 μm.

10. The preparation method according to claim 1, wherein the spherical silica powder filler has $Q_4$ unit content of at least 95% as measured by $^{29}$Si nuclear magnetic resonance (NMR), and an average particle size of the spherical silica powder filler is between 0.1 μm and 5 μm.

11. The preparation method according to claim 4, wherein the spherical silica powder filler has $Q_4$ unit content of at least 95% as measured by $^{29}$Si nuclear magnetic resonance (NMR), and an average particle size of the spherical silica powder filler is between 0.1 μm and 5 μm.

12. The preparation method according to claim 5, wherein the spherical silica powder filler has $Q_4$ unit content of at least 95% as measured by $^{29}$Si nuclear magnetic resonance (NMR), and an average particle size of the spherical silica powder filler is between 0.1 μm and 5 μm.

* * * * *